United States Patent [19]
Matsuo

[11] Patent Number: 5,986,599
[45] Date of Patent: Nov. 16, 1999

[54] VOLTAGE COMPARATOR FOR ANALOG-TO-DIGITAL CONVERTER

[75] Inventor: Tatsuyuki Matsuo, Nagasaki, Japan

[73] Assignee: Sony Corporation, Japan

[21] Appl. No.: 08/997,470

[22] Filed: Dec. 23, 1997

[30] Foreign Application Priority Data

Dec. 27, 1996 [JP] Japan .................................. 8-351651

[51] Int. Cl.[6] .................................................. H03M 1/34
[52] U.S. Cl. .......................................... 341/158; 327/94
[58] Field of Search .................................. 341/156, 158, 341/159; 327/91, 94, 97

[56] References Cited

U.S. PATENT DOCUMENTS

| | | | |
|---|---|---|---|
| 4,845,383 | 7/1989 | Lida | 341/158 |
| 5,654,713 | 8/1997 | Mayes et al. | 341/156 |
| 5,821,780 | 10/1998 | Hasegawa | 327/91 |

*Primary Examiner*—Howard L. Williams
*Attorney, Agent, or Firm*—Rader, Fishman & Grauer; Ronald P. Kananen

[57] ABSTRACT

At a sampling operation, an analog signal and an inverted signal thereof are respectively supplied to first and second sampling capacitor elements, DC components of input signals are supplied to first and second capacitors, and reference voltages are supplied to third and forth capacitors. At the time of the comparison operation, the reference voltages are respectively supplied to the first and the second sampling capacitor elements, the first and the third capacitors and the second and the forth capacitors are connected in parallel, respectively. Voltages of connection nodes thereof are input to an operational amplifier, therefore an A/D converter is obtained wherein a fluctuation of operation points of the operational amplifier at the time of the sampling operation and at the time of the comparison operation can be kept small, an improvement of a conversion precision and an operation stability can be achieved without being influenced by fluctuation of the DC component of the analog signal, and a high precision can be achieved.

12 Claims, 9 Drawing Sheets

VOLTAGE COMPARATOR FOR ANALOG-TO-DIGITAL CONVERTER

BACKGROUND OF THE INVENTION

1. Field of the Invention

The present invention relates to a voltage comparator and a parallel type or a successive approximation type analog-to-digital converter using same.

2. Description of the Related Art

An analog-to-digital converter (hereinafter referred to as an ADC) converts the level of an input analog signal to a digital signal. In general, there are two types of ADCs—a parallel type and a successive approximation type. In any ADC, a voltage comparator is provided for comparing the voltages of the analog signal and a reference signal. As one example of the voltage comparator, there can be mentioned a differential type voltage comparator. The differential type voltage comparator compares the magnitudes of the differential voltage of the reference signal and the differential voltage of the differential input signal and sets the level of the output signal in accordance with the result of the comparison.

FIG. 1 is a circuit diagram of the configuration of a parallel type ADC of the related art. This parallel type ADC is constituted by a plurality of resistors $R_1$ to $R_{15}$ connected in series, differential type voltage comparators $COMP_1$ to $COMP_{14}$, AND gates $AGT_1$ to $AGT_{15}$, an encoder ECD, and a control circuit TIMGEN. The plurality of resistors connected between the reference voltages VRT and VRB divides the difference of the reference voltages (VRT–VRB) to obtain a plurality of reference voltages $VRT_n$ and $VRB_n$ (n=1, 2, . . . , 14). The differential type voltage comparator $COMP_n$ compares the differential voltage of the reference signal ($VRT_n$–$VRB_n$) and the differential voltage of the differential input signal (AIN–XAIN) and sets the voltages of an output signal D and an inverted signal DX thereof in accordance with the result of comparison. The AND gates $AGT_1$ to $AGT_{15}$ output conversion codes in accordance with the result of comparison of the differential type voltage comparator. The encoder ECD converts the conversion codes from the AND gates $AGT_1$ to $AGT_{15}$ to for example binary codes.

A four-bit parallel type ADC shown in FIG. 1 has 15 voltage dividing resistors, 14 differential type voltage comparators, and 15 AND gates. An analog signal AIN, an inverted signal XAIN thereof, and a reference voltage $V_{ref}$ are input to each differential type voltage comparator. Note that the reference voltage $V_{ref}$ is the voltage of an intermediate level between the reference voltages VRT and VRB and, as shown in FIG. 2, is obtained by voltage division by the resistors $R_T$ and $R_B$ having the same resistance value connected in series between the reference voltages VRT and VRB. Further, the control circuit TIMGEN is provided in order to control the operation timing of the ADC.

The voltage comparators $COMP_1$ to $COMP_{14}$ constituting the parallel type ADC shown in FIG. 1 have the same configuration. Here, as a common example of them, an explanation will be made of the configuration and operation of a chopper type differential type voltage comparator COMP.

FIG. 3 is a circuit diagram of the configuration of a chopper type differential voltage comparator COMP constituted by switches 1 to 6, sampling use capacitor elements $C_{S1}$ and $C_{S2}$, a differential type operational amplifier 10, and a latch circuit 20.

The reference voltage $VRT_n$ and the analog signal AIN are selectively input to a node $ND_1$ by the switches 1 and 2, respectively. The reference voltage $VRB_n$ and the inverted signal XAIN of the analog signal AIN are selectively input to a node $ND_2$ by the switches 3 and 4, respectively. The sampling use capacitor element $C_{S1}$ is connected between the node $ND_1$ and the node $ND_3$, and the sampling use capacitor element $C_{S2}$ is connected between the node $ND_2$ and the node $ND_4$. The switch 5 is connected between the node $ND_3$ and the input terminal of the reference voltage $V_{ref}$, and the switch 6 is connected between the node $ND_4$ and the input terminal of the reference voltage $V_{ref}$. Capacitor elements $C_1$ and $C_2$ exist between the node $ND_3$ and the node $ND_4$ and a ground potential GND. Note that the capacitances of these capacitor elements are very small.

A voltage V– of the node $ND_3$ is input to an inverted input terminal (–) of the operational amplifier 10, and a voltage V+ of the node $ND_4$ is input to a non-inverted input terminal (+) of the operational amplifier 10. The output signal D of the operational amplifier 10, the output signal D of the inverted signal operational amplifier 10 thereof, and the inverted signal XD thereof are output via the latch circuit 20.

FIG. 4 is a waveform diagram of the operation of the chopper type differential voltage comparator shown in FIG. 3. The switches 1 and 3 are controlled in their conductive states by a clock signal $SCKD_2$, and the switches 2 and 4 are controlled in their conductive states by a clock signal XSCK. Further, the switches 5 and 6 are controlled in their conductive states by a clock signal $XSCKD_1$. The operation timing of the latch circuit 20 is controlled by a clock signal CCK.

The clock signal SCK is generated by the clock signal CLK. Its rising edge is the same as the clock signal CLK, and its trailing edge is delayed from the trailing edge of the clock signal CLK. The clock signals $SCKD_1$ and $SCKD_2$ are signals obtained by delaying the clock signal SCK.

In the chopper type differential voltage comparator shown in FIG. 3, the switches 1 and 3 are set to a conductive state when the clock signal $SCKD_2$ is at a high level and are set to a non-conductive state when it is at a low level. The switches 2 and 4 are set to a conductive state when the inverted signal XSCK of the clock signal SCK is at the high level and are set to a non-conductive state when it is at the low level. The switches 5 and 6 are set to a conductive state when the inverted signal $XSCKD_1$ of the clock signal $SCKD_1$ is at the high level and are set to a non-conductive state when it is at the low level.

Below, an explanation will be made of the operation of the voltage comparator COMP by referring to FIGS. 3 and 4. During the period when the clock signal SCK is at the low level, the sampling operation (sample) is carried out. During the period when it is at the high level, a hold and comparison operation (hold & comp, hereinafter, simply referred to as a comparison operation) is carried out.

During the sampling operation, the switches 2, 4, 5, and 6 are set in a conductive state, and the switches 1 and 3 are set in a non-conductive state. The analog signal AIN and the reference voltage $V_{ref}$ are supplied to the two sides of the sampling use capacitor element $C_{S1}$ whereby the sampling use capacitor element $C_{S1}$ is charged to (AIN–$V_{ref}$), and the inverted signal XAIN of the analog signal AIN and the reference voltage $V_{ref}$ are supplied to the two sides of the sampling use capacitor element $C_{S2}$ whereby the sampling use capacitor element $C_{S2}$ is charged to (XAIN–$V_{ref}$).

During the comparison operation, the switches 1 and 3 are set in a conductive state, and the other switches are set in a non-conductive state. By this, the voltages V– and V+ of the node $ND_3$ and node $ND_4$ are individually represented by following equations:

$$V-=-C_S(AIN-VRT_n)/(C_S+C_1)+V_{ref} \quad (1)$$

$$V+=-C_S(XAIN-VRB_n)/(C_S+C_1)+V_{ref} \quad (2)$$

Here, assume that the capacitances of the sampling use capacitor elements $C_{S1}$ and $C_{S2}$ are the same, that is, $C_S$, and the capacitances of the capacitor elements $C_1$ and $C_2$ are the same, that is. $C_1$.

The differential voltage of the voltages V+ and V− is represented by the following equation:

$$(V+)-(V-)=(AIN-XAIN)-(VRT_n-VRB_n) \quad (3)$$

The differential voltage of the voltages V+ and V− is amplified by the operational amplifier 10. The output signal D and the inverted signal XD thereof are latched by the latch circuit 20 at for example the rising edge of the clock signal CCK and output to an external unit.

In the differential type voltage comparator of the related art explained above, when the analog signal AIN and the inverted signal XAIN thereof are within the range of the reference voltages VRT and VRB as shown in FIG. 5, the reference voltage $V_{ref}$ becomes the same level as that of the DC component $V_C$ of the analog signal AIN, and the operational amplifier 10 uses the reference voltage $V_{ref}$, that is, the DC component $V_C$ of the analog signal AIN, as the operation point. However, when the analog signal AIN and the inverted signal XAIN thereof are out of the range of the reference voltages VRT and VRB, that is, when the DC component $V_C$ of the analog signal AIN and the inverted signal XAIN thereof deviate from the center value $V_{ref}$ of the reference voltages VRT and VRB, the operation point of the operational amplifier 10 fluctuates during the sampling and comparison operations of the ADC. When the operation point becomes out of the input range of the operational amplifier 10, there is a problem that the voltage comparison is no longer correctly carried out and the precision of conversion of the ADC is deteriorated.

In order to solve this problem, it is necessary to shift the level of the analog signal AIN and the inverted signal XAIN thereof before the ADC input by using a full differential type operational amplifier as shown in FIG. 6. The full differential type operational amplifier in this case directly handles the input signal, therefore it is necessary to use one having excellent gain characteristics and frequency characteristics for the frequency of the input signal and the number of bits and conversion speed of the ADC. This causes an increase of the size of the circuit of the ADC and an increase of the costs. Further, the power consumption is increased due to the use of the high performance operational amplifier.

SUMMARY OF THE INVENTION

An object of the present invention is to provide a voltage comparator capable of improving the precision of conversion and operational stability without an increase of the size of the circuit and without being influenced by fluctuations of the DC component of the input signal and to provide an ADC using same.

To attain the above object, according to a first aspect of the present invention, there is provided a voltage comparator performing a sampling operation and a comparison operation and comparing a differential voltage between an input signal and an inverted signal thereof with a differential voltage of first and second reference signals, comprising a first sampling use capacitor element for storing a charge in accordance with the input signal at the time of the sampling operation and for storing a charge in accordance with the first reference signal and the input signal at the time of the comparison operation; a second sampling use capacitor element for storing a charge in accordance with the inverted signal of the input signal at the time of the sampling operation and for storing a charge in accordance with the second reference signal and the inverted signal of the input signal at the time of the comparison operation; a first capacitor element, with one electrode which is connected to a first node common with the first sampling use capacitor element and with another electrode which is connected to a common potential, which stores a charge in accordance with the DC component of the input signal at the time of the sampling operation; a second capacitor element, with one electrode which is connected to a second node common with the second sampling use capacitor element and with another electrode which is connected to a common potential, which stores a charge in accordance with the DC component of the input signal at the time of the sampling operation; a third capacitor element, with one electrode which is connected to a third node and with another electrode which is connected to a common potential, which stores a charge in accordance with the first and second reference signals at the time of the sampling operation; a fourth capacitor element, with one electrode which is connected to a fourth node and with another electrode which is connected to a common potential, which stores a charge in accordance with the first and second reference signals at the time of the sampling operation; a first switching means for connecting the first node and the third node so as to generate at the connection point a first voltage in accordance with the stored charge of each capacitor element connected to the connection point at the time of the comparison operation and separating the first node and the third node at the time of the sampling operation; a second switching means for connecting the second node and the fourth node to generate at the connection point a second voltage in accordance with the stored charge of each capacitor element connected to the connecting point at the time of the comparison operation and separating the second node and the fourth node at the time of the sampling operation; and a voltage comparing means for comparing the first voltage and second voltage.

Further, according to a second aspect of the present invention, there is provided an analog-to-digital converter for generating a digital code in accordance with the level of an input signal, which is of the successive approximation type for sequentially deciding bits from the most significant bit to the least significant bit of the digital code by repeatedly performing a sampling operation and comparison operation, comprising a first sampling use capacitor element for storing a charge in accordance with the input signal at the time of the sampling operation and for storing a charge in accordance with a first decision use reference signal generated from first and second reference signals and the input signal in accordance with the decided bit at the time of the comparison operation; a second sampling use capacitor element for storing a charge in accordance with an inverted signal of the input signal at the time of the sampling operation and for storing a charge in accordance with a second decision use reference signal generated from the first and second reference signals and the inverted signal of the input signal in accordance with the decided bit at the time of the comparison operation; a first capacitor element, with one electrode which is connected to a first node common with the first sampling use capacitor element and with another electrode which is connected to a common potential, which stores a charge in accordance with the DC component of the input signal at the time of the sampling operation; a second capacitor element, with one electrode which is connected to a second node common with the second sampling use capacitor element and with another electrode which is connected to a common potential, which stores a charge in accordance with the DC component of the input signal at the time of the sampling operation; a third capacitor element, with one electrode which is connected to a third node and with another electrode which is connected to a common potential, which stores a charge in accordance with the first and second reference signals at the time of the sampling operation; a fourth capacitor element, with one electrode which is connected to a fourth node and with another electrode which is connected to a common potential, which stores a charge in accordance with the first and second reference signals at the time of the sampling operation; a first switching means for connecting the first node and the third node so as to generate at a connection point a first voltage in accordance with the stored charge of each capacitor element connected to the connection point at the time of the comparison operation and separating the first node and the third node at the time of the sampling operation; a second switching means for connecting the second node and the fourth node so as to generate at the connection point a second voltage in accordance with the stored charge of each capacitor element connected to the connection point at the time of the comparison and separating the second node and the fourth node at the time of the sampling operation; a voltage comparing means for comparing the first voltage and second voltage; and a control circuit for controlling the sampling and the comparison operation and determining each bit of the digital code in accordance with the result of comparison of the voltage comparing means.

Further, in the present invention, preferably the above successive approximation type analog-to-digital converter is a voltage re-distribution type analog-to-digital converter, in which the first sampling use capacitor element comprises a plurality of capacitors provided in accordance with the number of bits of the digital code, each of which has one electrode which is commonly connected, has another electrode to which the input signal is supplied at the time of the sampling operation, and receives either of the first or second reference signal in accordance with the decided bit at the time of the comparison operation; and the second sampling use capacitor element comprises a plurality of capacitors provided in accordance with the number of bits of the digital code, each of which has one electrode which is commonly connected, has another electrode to which an inverted signal of the input signal is supplied at the time of the sampling operation, and receives either of the first or second reference signal in accordance with the decided bit at the time of the comparison operation.

Further, in the present invention, preferably the above successive approximation type analog-to-digital converter is a resistor voltage division type analog-to-digital converter which has a plurality of voltage division use resistors provided in accordance with the number of bits of the digital code which are connected in series between the first and second reference signals to generate a plurality of pairs of first and second reference signals, and the control circuit selects a pair from among the plurality of pairs of reference signals in accordance with the decided bit at the time of the comparison operation and supplies the same to the first and second sampling use capacitor elements.

Further, according to a third aspect of the present invention, there is provided an analog-to-digital converter for generating a digital code in accordance with the level of an input signal, which is of a parallel type having a plurality of voltage division use resistors provided in accordance with the number of bits of the digital code which are connected in series between first and second reference signals, a comparator for performing a comparison operation based on a plurality of pairs of reference signals comprised by first and second reference signals generated by these resistors and forming pairs and the input signal, and an encoder for generating the digital code in accordance with the result of comparison of the comparator, wherein the comparator comprises a plurality of voltage comparators for performing a sampling operation and a comparison operation, each voltage comparator comparing a differential voltage of the input signal and an inverted signal thereof and a differential voltage of a pair of reference signals selected from among the plurality of pairs of reference signals, the voltage comparator comprising: a first sampling use capacitor element for storing a charge in accordance with the input signal at the time of the sampling operation and for storing a charge in accordance with the first reference signal and the input signal at the time of the comparison operation; a second sampling use capacitor element for storing a charge in accordance with the inverted signal of the input signal at the time of the sampling operation and for storing a charge in accordance with the second reference signal and the inverted signal of the input signal at the time of the comparison operation; a first capacitor element, with one electrode which is connected to a first node common with the first sampling use capacitor element and with another electrode which is connected to a common potential, which stores a charge in accordance with the DC component of the input signal at the time of the sampling operation; a second capacitor element, with one electrode which is connected to a second node common with the second sampling use capacitor element and with another electrode which is connected to a common potential, which stores a charge in accordance with the DC component of the input signal at the time of the sampling operation; a third capacitor element, with one electrode which is connected to a third node and with another electrode which is connected to a common potential, which stores a charge in accordance with the intermediate level of the first and second reference signals at the time of the sampling operation; a fourth capacitor element, with one electrode which is connected to a fourth node and with another electrode which is connected to a common potential, which stores a charge in accordance with the intermediate level of the first and second reference signals at the time of the sampling operation: a first switching means for connecting a first node and a third node so as to generate at the connection point a first voltage in accordance with the stored charge of each capacitor element connected to the connection point at the time of the comparison operation and separating the first node and the third node at the time of the sampling operation; a second switching means for connecting a second node and a fourth node so as to generate at the connection point a second voltage in accordance with the stored charge of each capacitor element connected to the connection point at the time of the comparison operation and separating the second node and the fourth node at the time of the sampling operation; and a voltage comparing means for comparing the first voltage and second voltage.

According to the present invention, in the voltage comparator, at the time of the sampling operation and comparison operation, the charging and discharging operations of the first and second sampling use capacitor elements and the first to fourth capacitor elements are controlled by switches, the input signal and the inverted signal thereof are respectively supplied to the first and second sampling use capacitor elements at the time of the sampling operation, and charges in accordance with the supplied voltages are stored in the first and second sampling use capacitor elements. Further, the DC components of the input signals are supplied to the first and second capacitor elements, the intermediate level voltage of the first and second reference signals is supplied to the third and fourth capacitor elements, and charges in accordance with the supplied voltages are stored in these capacitor elements.

The first and second reference signals are respectively supplied to the first and second sampling use capacitor elements at the time of the comparison operation, a charge in accordance with the differential voltage between the first reference signal and the input signal is stored in the first sampling use capacitor element, and a charge in accordance with the differential voltage of the second reference signal and the inverted signal of the input signal is stored in the second sampling use capacitor element. Further, the first and third nodes are connected, the second and fourth nodes are connected, and the voltages at the connection points are amplified and output by a differential type amplification circuit, therefore the fluctuation of the operation point of the differential type amplification circuit at the time of the sampling operation and at the time of the comparison operation can be kept small and an improvement of the operation precision and operation stability of the voltage comparator can be achieved.

Further, by constituting the parallel type analog-to-digital converter or the successive approximation type analog-to-digital converter by using the voltage comparator of the present invention, an improvement of the conversion precision and an enhancement of the operation stability can be realized without increasing the size of the analog-to-digital converter.

BRIEF DESCRIPTION OF THE DRAWINGS

These and other objects and features of the present invention will become clearer from the following description of the preferred embodiments given with reference to the attached drawings, in which.

DESCRIPTION OF THE PREFERRED EMBODIMENTS

Figure 1:
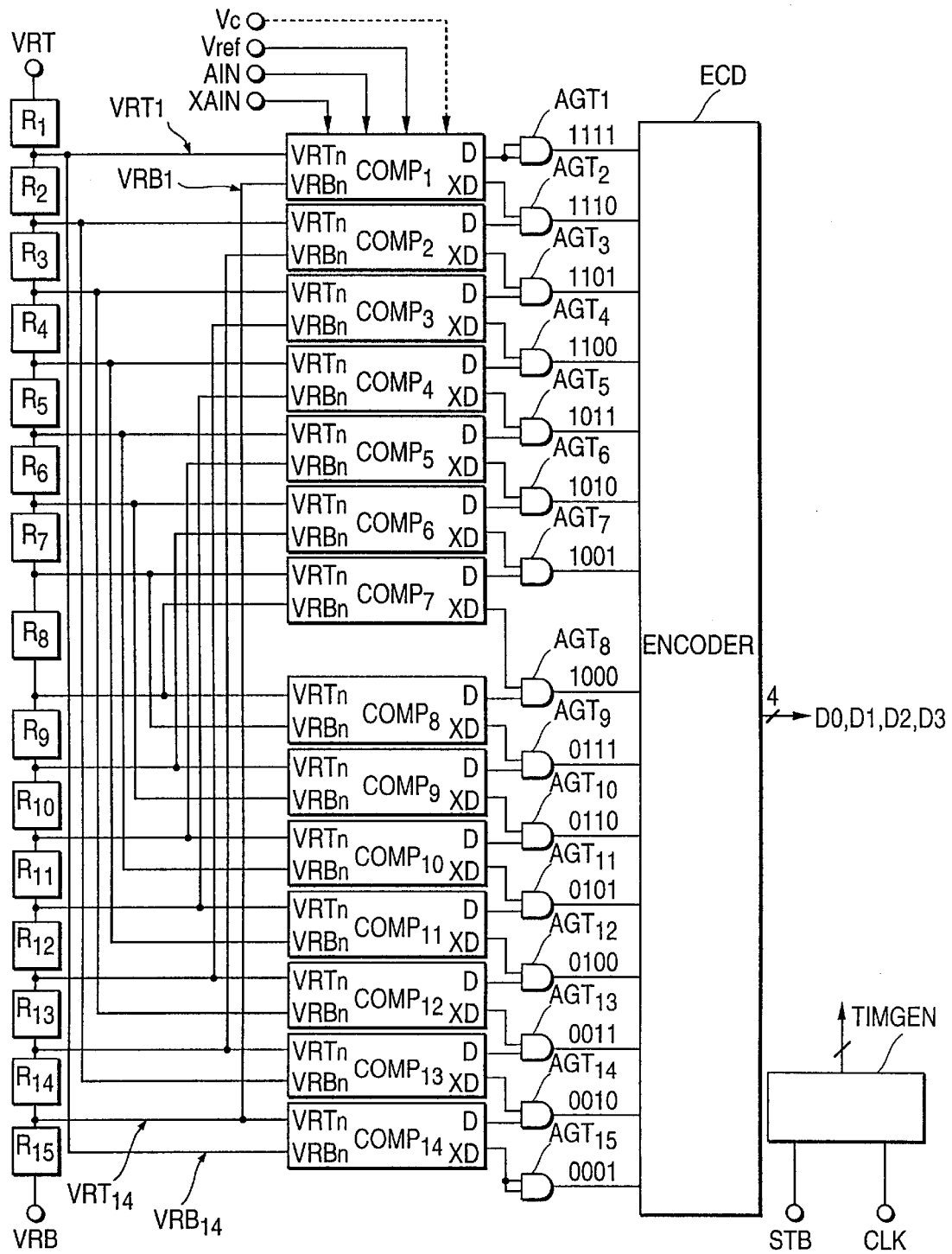
FIG. 1 is a circuit diagram of a parallel type ADC of the related art.
Figure 2:
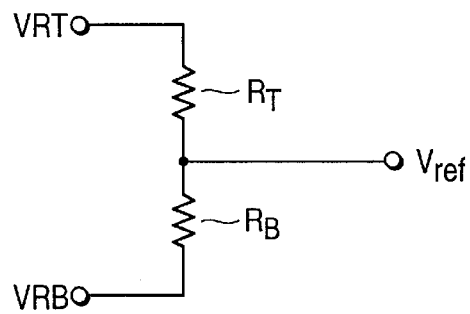
FIG. 2 is a circuit diagram of a generation circuit of a reference voltage $V_{ref}$.

Next, a detailed explanation will be made of embodiments of the present invention by referring to the drawings.

Figure 7:
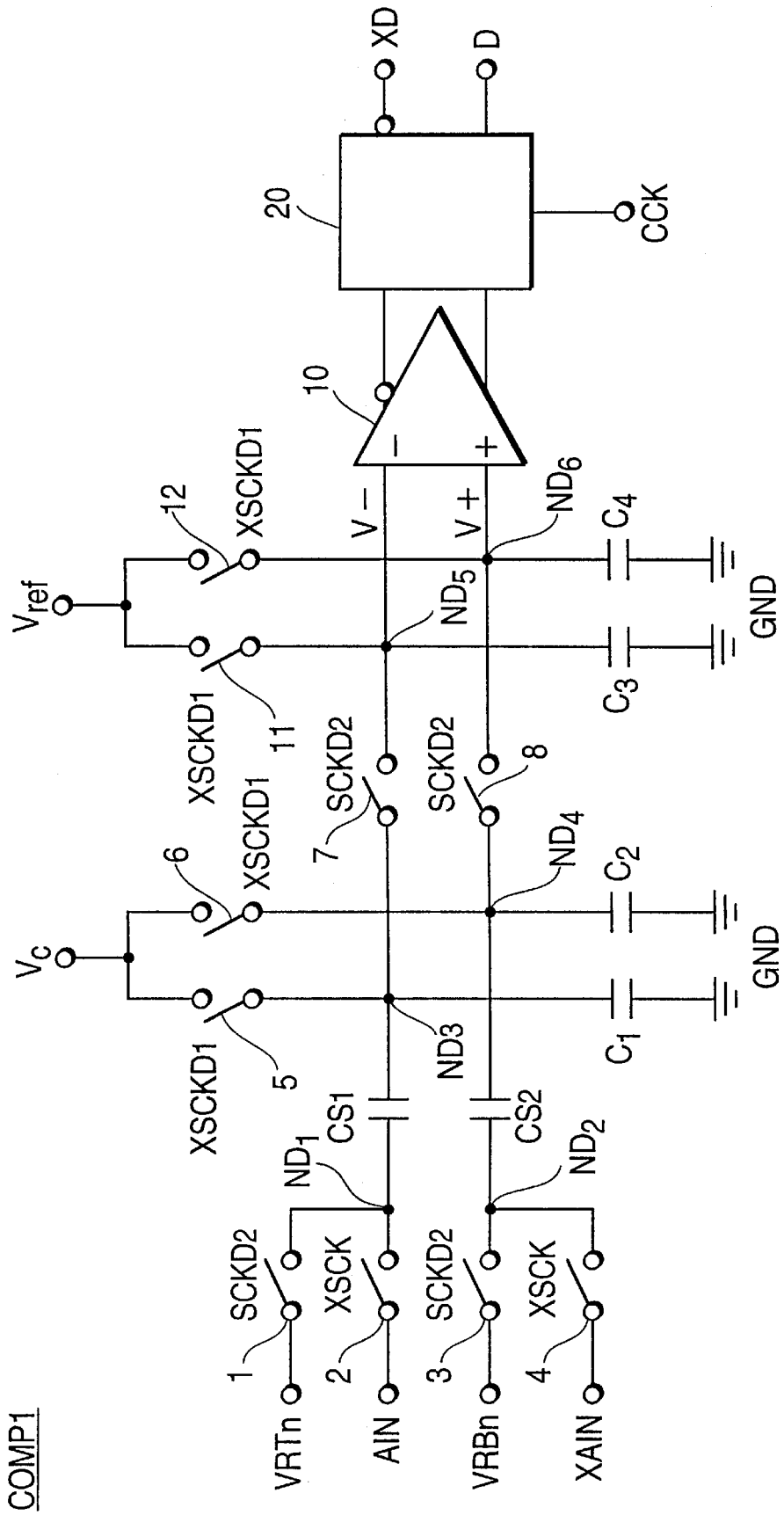
FIG. 7 is a circuit diagram of a first embodiment of the voltage comparator according to the present invention.

FIG. 7 is a circuit diagram of an embodiment of a voltage comparator according to the present invention.

Figure 3:
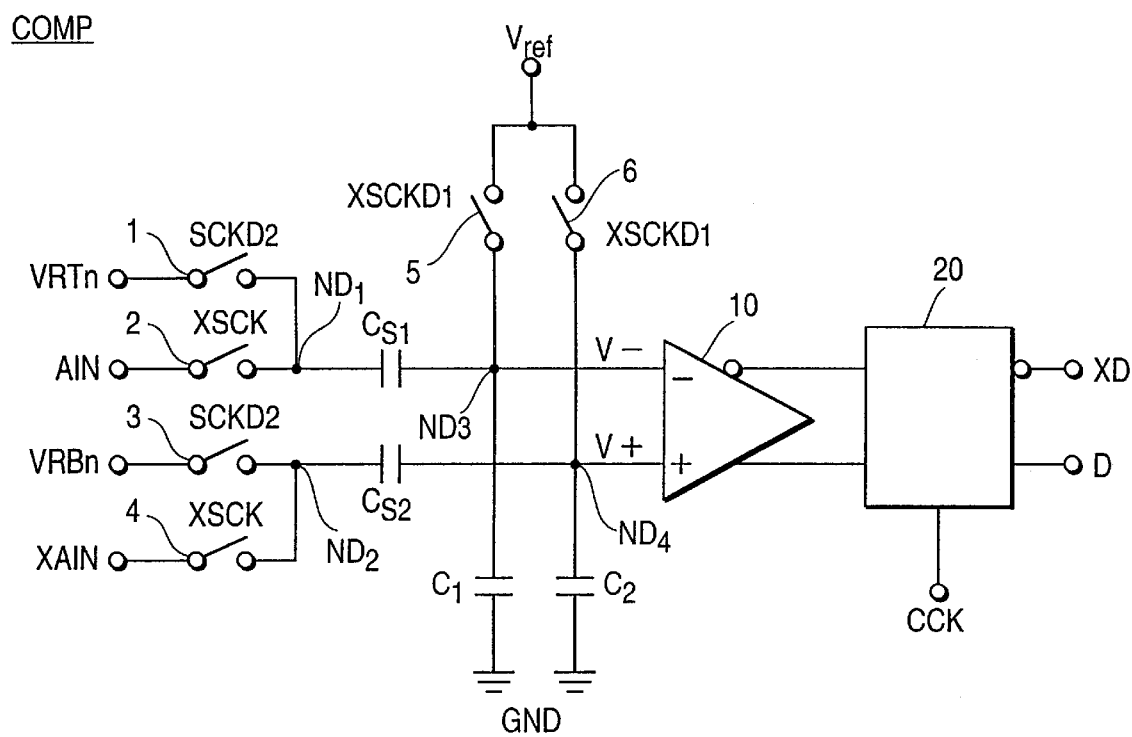
FIG. 3 is a circuit diagram of a voltage comparator of the related art.

The voltage comparator COMP1 of the present embodiment is different from the chopper type differential voltage comparator COMP of the related art shown in FIG. 3 in the point that switches 7 and 8 are added between the node $ND_3$ and node $ND_4$, and the input terminal of the operational amplifier 10.

The node $ND_3$ is selectively connected to the node $ND_5$ by the switch 7, and the node $ND_4$ is selectively connected to the node $ND_6$ by the switch 8. A switch 11 is connected between the node $ND_5$ and the input terminal of the reference voltage $V_{ref}$, and a switch 12 is connected between the node $ND_6$ and the input terminal of the reference voltage $V_{ref}$.

Capacitor elements $C_3$ and $C_4$ exist between the node $ND_5$ and the node $ND_6$ and the ground potential GND. The node $ND_5$ and the node $ND_6$ are respectively connected to the inverted input terminal (−) and the non-inverted input terminal (+) of the operational amplifier 10. Further, the output signal D of the operational amplifier 10 and the inverted signal XD thereof are output via the latch circuit 20.

The switches 7 and 8 are controlled by a clock signal $SCKD_2$. and the switches 11 and 12 are controlled by an inverted signal $XSCKD_1$ of the clock signal $SCKD_1$. The switches 7 and 8 are set to a conductive state when the clock signal $SCKD_2$ is at the high level and are set to a non-conductive state when it is at the low level. The switches 11 and 12 are set to a conductive state when the inverted signal $XSCKD_1$ of the clock signal $SCKD_1$ is at the high level and set to a non-conductive state when it is at the low level.

Figure 8:
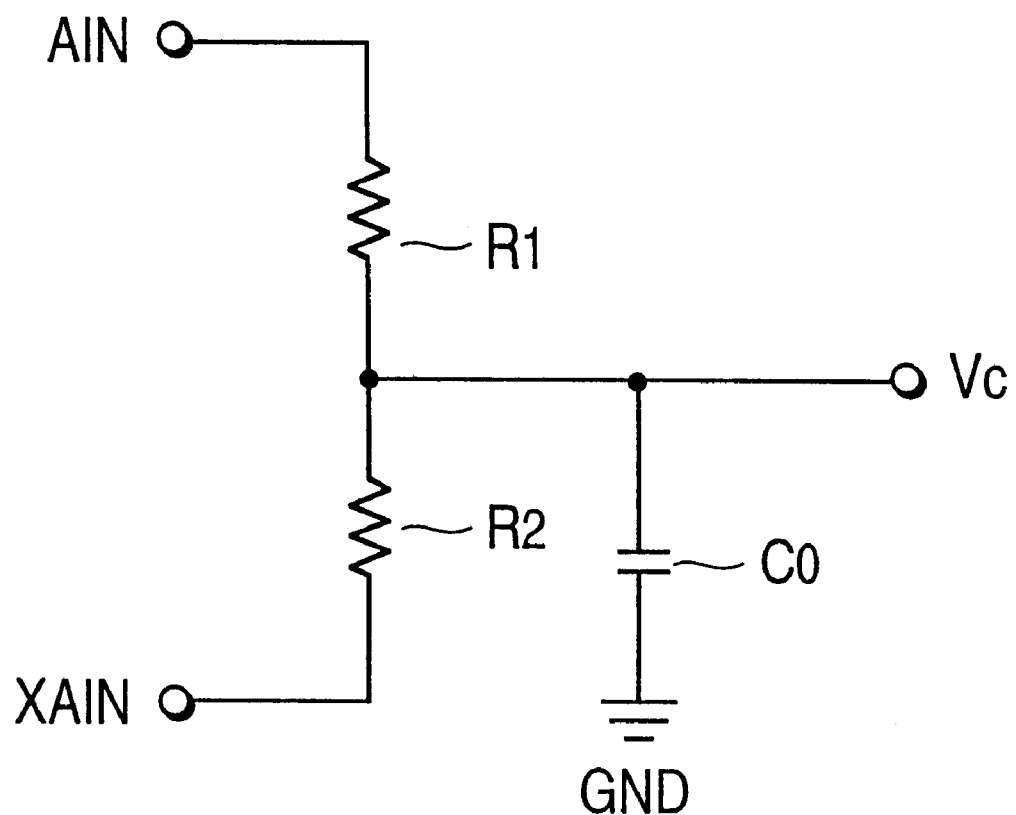
FIG. 8 is a circuit diagram of a generation circuit of a DC component $V_C$.

In the present embodiment, the reference voltage $V_{ref}$ is the intermediate voltage of the reference voltages VRT and VRB. Namely, $V_{ref}=(VRT+VRB)/2$. Further, the voltage $V_C$ selectively input to the nodes $ND_3$ and $ND_4$ via the switches 5 and 6 is the DC component of the analog signal AIN and detected by a low pass filter comprising the resistors $R_1$ and $R_2$ and a capacitor element $C_0$ shown in FIG. 8.

Figure 9:
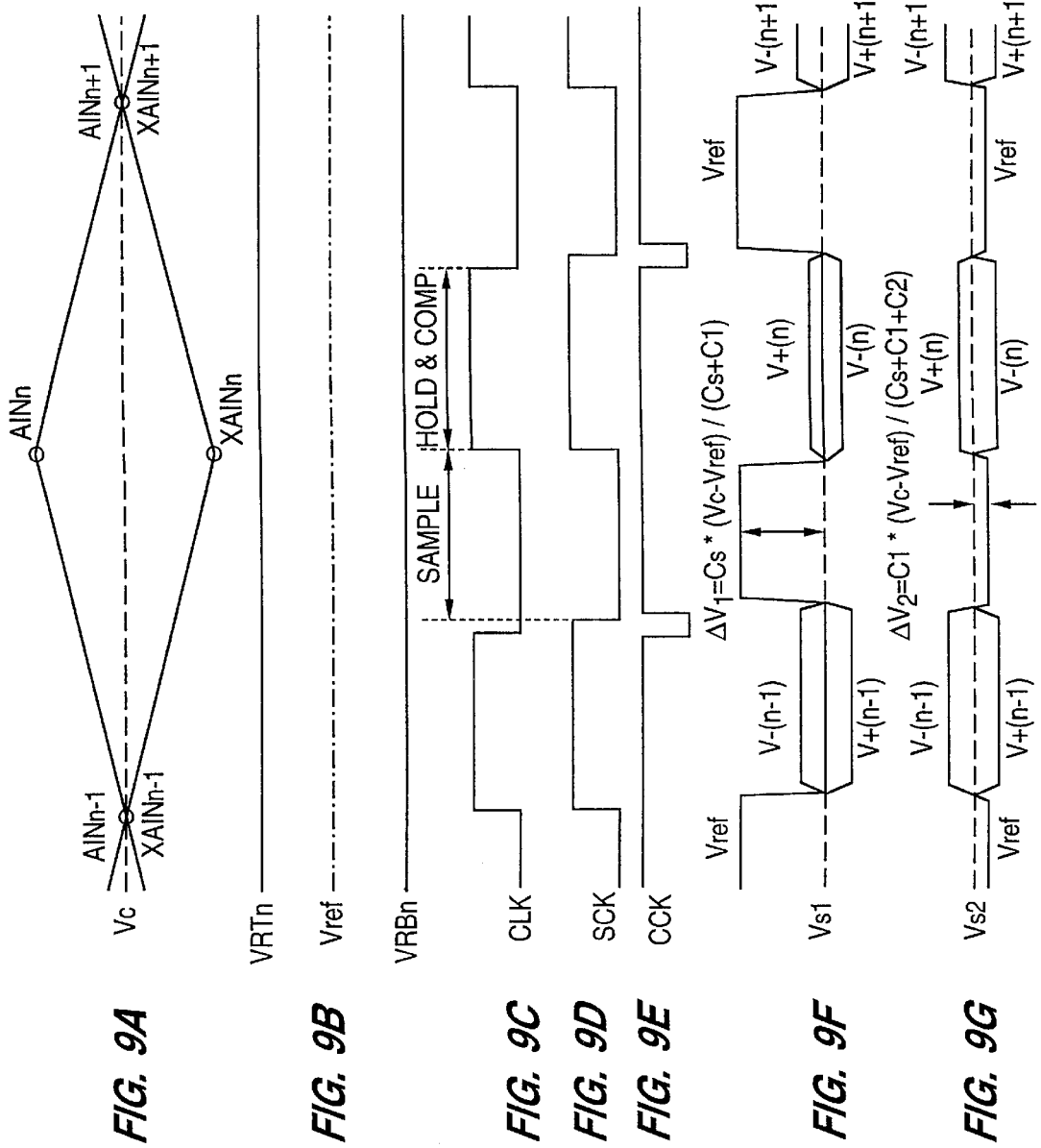
FIGS. 9A to 9G are waveform diagrams of the voltage comparator.

FIG. 9 is a waveform diagram of the operation of the voltage comparator COMP1 of the present embodiment. Below, an explanation will be made of the operation of the present embodiment by referring to FIG. 7 and FIG. 9.

Figures 4A, 4B, 4C, 4D, 4E, 4F, 4G, 4H:
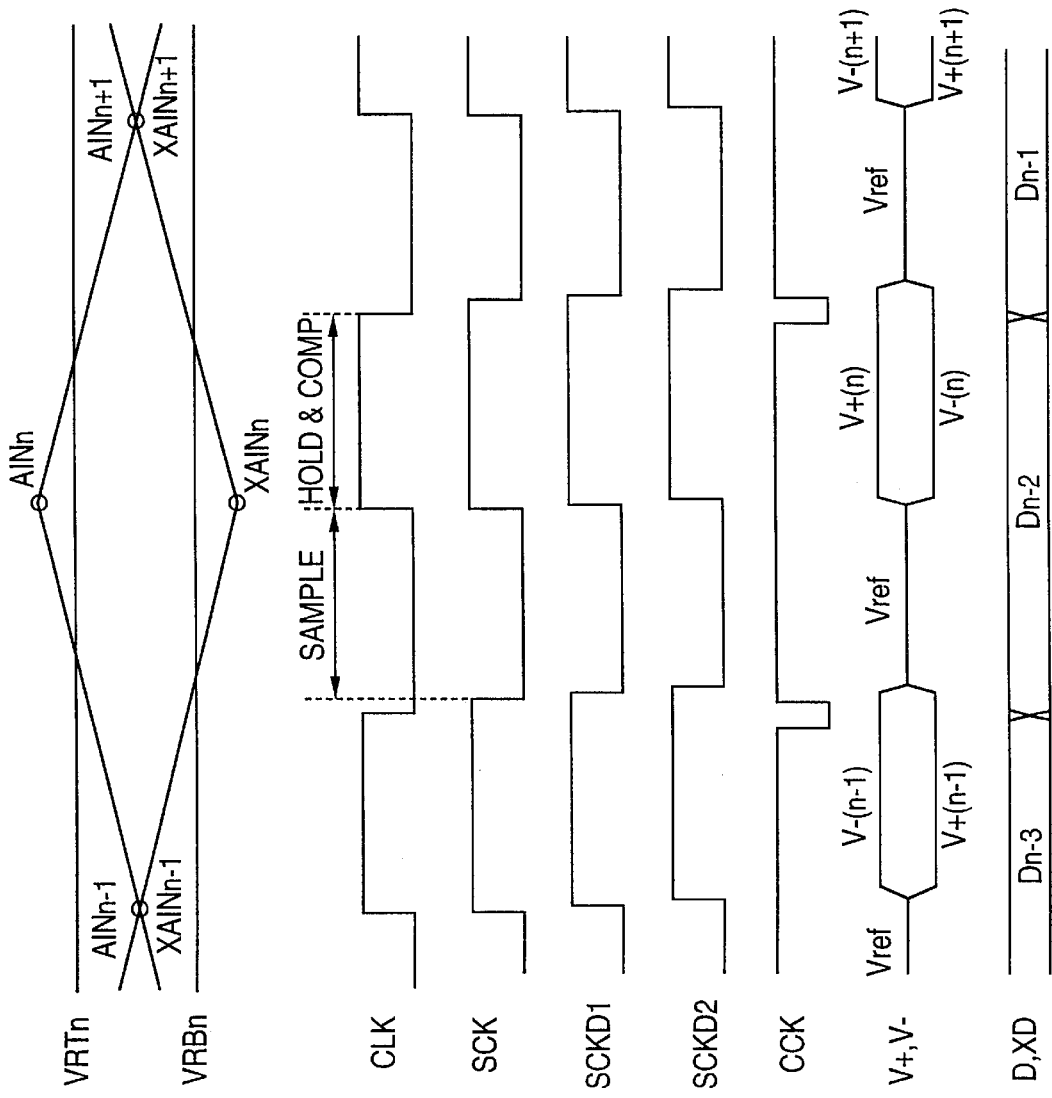
FIGS. 4A to 4H are waveform diagrams of the voltage comparator shown in FIG. 3.
Figure 5:
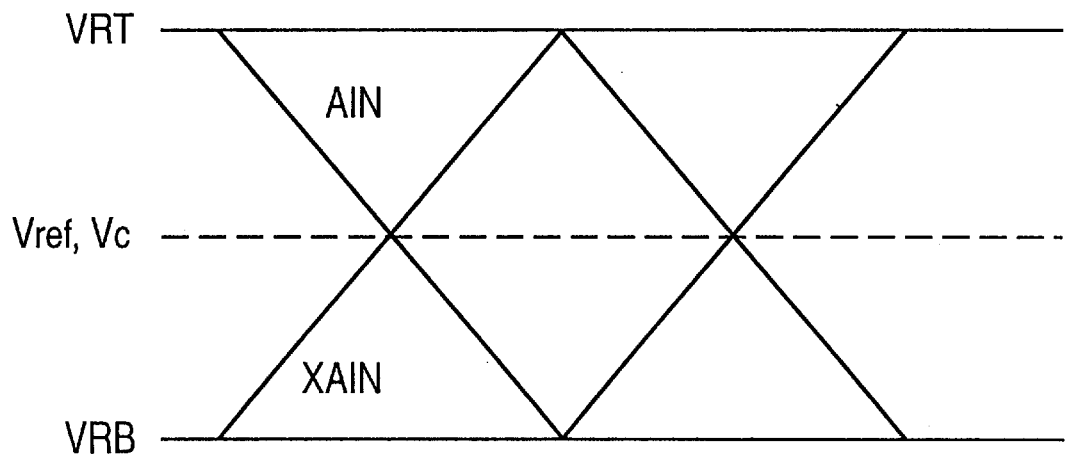
FIG. 5 is a waveform diagram of the reference voltage and an analog signal.
Figure 6:
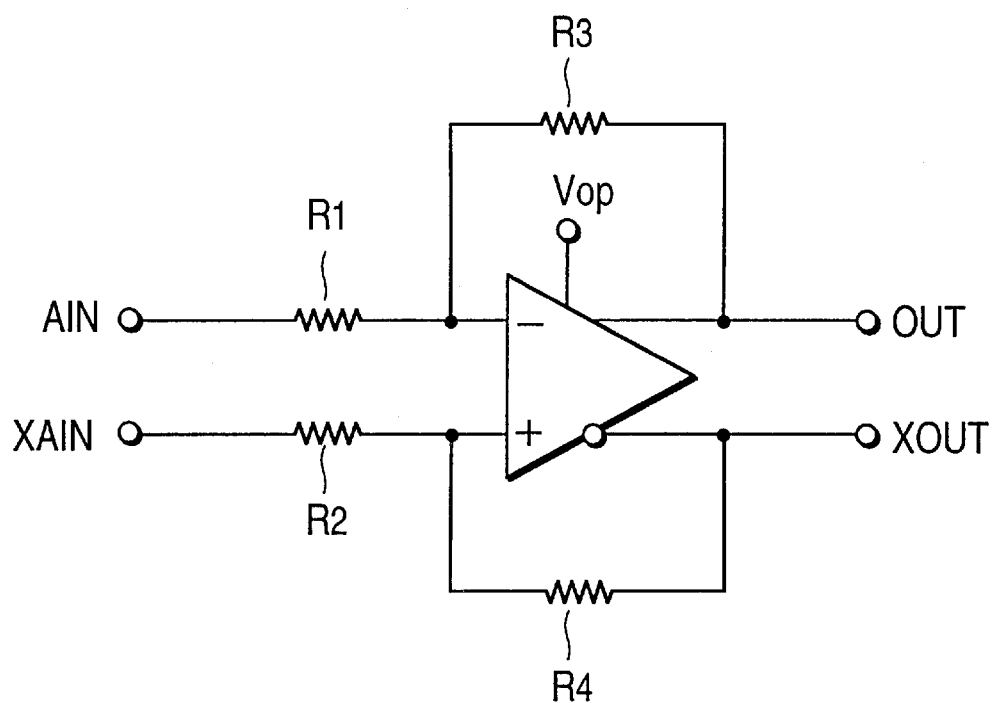
FIG. 6 is a circuit diagram of a full differential type operational amplifier.

The clock signal SCK of FIG. 9 is generated by the clock signal CLK. The rising edge is the same as the clock signal CLK, and the trailing edge is delayed from the trailing edge of the clock signal CLK. In FIG. 9, the clock signals $SCKD_1$ and $SCKD_2$ for controlling the conductive state of the switches are similar to the clock signals of the voltage comparator COMP of the related art shown in FIG. 4. Here, waveforms of these signals are omitted.

The sampling operation is carried out while the clock signal SCK is at the low level, while the comparison operation is carried out while this is at the high level.

During the sampling operation, the switches 2, 4, 5, 6, 11, and 12 are set to a conductive state, and the switches 1, 3, 7, and 8 are set to a non-conductive state. By this, the analog signal AIN and the DC component $V_C$ of the analog signal AIN are supplied to the two sides of the sampling use capacitor element $C_{S1}$ so a charge in accordance with (AIN–$V_C$) is stored in the sampling use capacitor element $C_{S1}$, and the inverted signal XAIN of the analog signal AIN and the DC component $V_C$ of the analog signal AIN are supplied to the two sides of the sampling use capacitor element $C_{S2}$ so a charge in accordance with (XAIN–$V_C$) is stored in the sampling use capacitor element $C_{S2}$.

The DC component $V_C$ is supplied to the capacitor elements $C_1$ and $C_2$ connected to the nodes $ND_3$ and $ND_4$, while the voltage of the reference voltage $V_{ref}$ level is supplied to the capacitor elements $C_3$ and $C_4$ connected to the nodes $ND_5$ and $ND_6$, therefore charges in accordance with the supplied voltages are stored in these capacitor elements.

During the comparison operation, the switches, 1, 3, 7, and 8 are set to a conductive state, and the other switches are set to a non-conductive state. By this, reference voltages $VRT_n$ and $VRB_n$ are respectively supplied to the nodes $ND_1$ and $ND_3$.

In the example shown in FIG. 9A, the DC component $V_C$ of the analog signal AIN is out of range of the reference voltages $VRT_n$ and $VRB_n$. When such an analog signal AIN and the inverted signal XAIN thereof are input to the voltage comparator COMP of the related art shown in FIG. 3, during the comparison operation, the voltages V+ and V– of the nodes $ND_3$ and $ND_4$ become as shown in the following equations. Note that, in the voltage comparator COMP of the related art, the reference voltage $V_{ref}$ is set to an intermediate voltage of the reference voltages $VRT_n$ and $VRB_n$ as shown in FIG. 9A.

$$V-=-C_S\{(AIN-V_C)-(VRT_n-V_{ref})\}/(C_S+C_1)+V_{ref}-C_S(V_C-V_{ref})/(C_S+C_1) \quad (4)$$

$$V+=-C_S\{(XAIN-V_C)-(VRB_n-V_{ref})\}/(C_S+C_1)+V_{ref}-C_S(V_C-V_{ref})/(C_S+C_1) \quad (5)$$

The operation points of the operational amplifier 10 at the time of the sampling operation and the comparison operation fluctuate as shown in FIG. 9F. At the time of the sampling operation, the operation point of the operational amplifier 10 is set to the reference voltage $V_{ref}$, and the operation point $V_{S1}$ of the operational amplifier 10 at the time of the comparison operation is found from the following equation:

$$V_{S1}=V_{ref}-C_S(V_C-V_{ref})/(C_S+C_1) \quad (6)$$

In this way, in the voltage comparator COMP of the related art, the difference $\Delta V_1$ of the operation points of the operational amplifier 10 at the time of the sampling operation and at the time of the comparison operation is $\Delta V_1 = C_S(V_C-V_{ref})/(C_S+C_1)$ as shown in FIG. 9F.

However, when the same analog signal AIN and the inverted signal XAIN thereof are input to the voltage comparator COMP1 of the present embodiment shown in FIG. 7, during the comparison operation, the voltages V+ and V– of the nodes $ND_5$ and $ND_6$ respectively become as shown in the following equations:

$$V-=-C_S\{(AIN-V_C)-(VRT_n-V_{ref})\}/(C_S+C_1+C_2)+V_{ref}-C_1(V_C-V_{ref})/(C_S+C_1+C_2) \quad (7)$$

$$V+=-C_S\{(XAIN-V_C)-(VRB_n-V_{ref})\}/(C_S+C_1+C_2)+V_{ref}-C_S(V_C-V_{ref})/(C_S+C_1+C_2) \quad (8)$$

Here, the capacitances of the capacitor elements $C_3$ and $C_4$ are set to the same $C_2$. In the present embodiment, the operation point of the operational amplifier 10 is set to the reference voltage $V_{ref}$ at the time of the sampling operation. At the time of the comparison operation, the operation point $V_{S2}$ of the operational amplifier 10 is found by following equation:

$$V_{S2}=V_{ref}+C_1(V_C-V_{ref})/(C_S+C_1+C_2) \quad (9)$$

Namely, in the voltage comparator COMP1 of the present embodiment, the difference $\Delta V_2$ of the operation points of the operational amplifier 10 at the time of the sampling operation and at the time of the comparison operation is $\Delta V_2 = C_1 (V_C-V_{ref})/(C_S+C_1+C_2)$ as shown in FIG. 9G.

When the capacitances $C_1$ and $C_2$ of the capacitor elements $C_1$, $C_2$, $C_3$, and $C_4$ are very small, that is, when ($C_S >> C_1, C_2$), it becomes ($\Delta V_2 << \Delta V_1$). Compared with the voltage comparator COMP of the related art, the fluctuation of the operation point of the voltage comparator COMP1 of the present invention becomes very small.

Note that when the DC component $V_C$ of the analog signal AIN is within the range of the reference voltages VRT and VRB, the fluctuation of the operation point at the time of the sampling operation and at the time of the comparison operation is small in both of the voltage comparator COMP1 of the present embodiment and the voltage comparator COMP of the related art, so a detailed explanation of this will be omitted.

As explained above, according to the present embodiment, the reference voltage $VRT_n$ and the analog signal AIN are selectively input to the node $ND_1$ by the switches 1 and 2, the reference voltage $VRB_n$ and the inverted signal XAIN are selectively input to the node $ND_2$ by the switches 3 and 4, the sampling use capacitor elements $C_{S1}$ and $C_{S2}$ are connected between the nodes $ND_1$ and $ND_3$ and between the nodes $ND_2$ and $ND_4$, the switches 5 and 6 are connected between the nodes $ND_3$ and $ND_4$ and the input terminal of the DC component $V_C$, the switches 7 and 8 are connected between the nodes $ND_3$ and $ND_5$ and the nodes $ND_4$ and $ND_6$, the switches 11 and 12 are connected between the nodes $ND_5$ and $ND_6$ and the input terminal of the reference voltage $V_{ref}$, the switches 2, 4, 5, 6, 11, and 12 are made conductive at the time of the sampling operation, the switches 1, 3, 7 and 8 are made conductive at the time of the comparison operation, the voltages V– and V+ of the nodes $ND_5$ and $ND_6$ are input to the operational amplifier 10, and the output signals D and DX of the operational amplifier 10 are output via the latch circuit 20, therefore the fluctuation of the operation points of the operational amplifier 10 at the time of the sampling operation and at the time of the comparison operation can be kept small and an improvement of the conversion precision and the operation stability can be achieved without being influenced by the fluctuation of the DC component of the analog signal.

Next, an explanation will be made of a second embodiment of the present invention.

Figure 10:
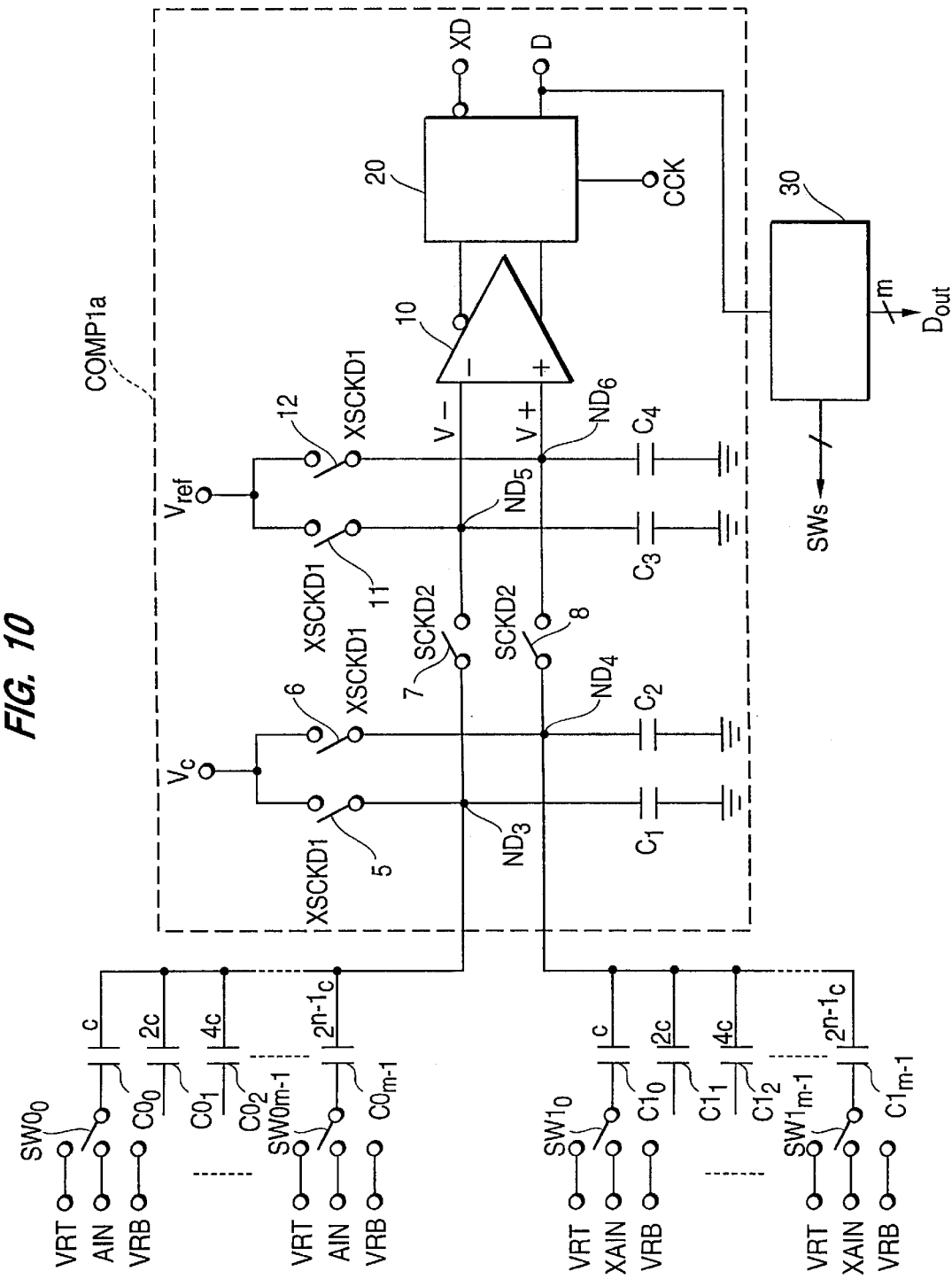
FIG. 10 is a circuit diagram of a charge redistribution type successive approximation type ADC using the voltage comparator according to a second embodiment of the present invention.

FIG. 10 is a circuit diagram of an example of a successive approximation type ADC using the voltage comparator of the present embodiment.

The illustrated successive approximation type ADC is a charge redistribution type successive approximation ADC constituted by a first sampling use capacitor element comprising m number of capacitors $C0_0$, $C0_1$, $C0_2$, . . . , and $C0_{m-1}$, a second sampling use capacitor element comprising m number of capacitors $C1_0$, $C1_1$, $C1_2$, . . . , $C1_{m-1}$, switches $SW0_0$ to $SW0_{m-1}$, $SW1_0$ to $SW1_{m-1}$, a voltage comparator COMP1a, and a control circuit 30.

The capacitances of the capacitors $C0_0$, $C0_1$, $C0_2$, . . . , $C0_{m-1}$ are set to c, 2c, 4c, . . . , and $2^{m-1}$, respectively, while the capacitances of the capacitors $C1_0$, $C1_1$, $C1_2$, ..., and $C1_{m-1}$ are set to c, 2c, 4c, and $2^{m-1}$c, respectively.

The voltage comparator COMP1a is obtained by removing the sampling use capacitor elements $C_{S1}$ and $C_{S2}$ from the voltage comparator COMP1 shown in FIG. 7. In the present embodiment, the sampling use capacitor element $C_{S1}$ is comprised by the capacitors $C0_0$, $C0_1$, $C0_2$, ..., and $C0_{m-1}$, and the sampling use capacitor element $C_{S2}$ is comprised by the capacitors $C1_0$, $C1_1$, $C1_2$, ..., and $C1_{m-1}$.

The control circuit 30 outputs the control signal $SW_S$ for controlling the ON/OFF state of the switches $SW0_0$ to $SW0_{m-1}$ and $SW1_0$ to $SW1_{m-1}$. Clock signals for controlling the sampling and comparison operations are supplied to the voltage comparator COMP1a, the output signal D is received from the voltage comparator COMP1a, and m number of bits of the digital code $D_{out}$ are output in accordance with this.

In the successive approximation type ADC, the digital code $D_{out}$ is sequentially determined from the most significant bit to the least significant bit. The charge redistribution type successive approximation ADC shown in FIG. 10 is controlled in the ON/OFF state of its switches $SW0_0$ to $SW0_{m-1}$ and $SW1_0$ to $SW1_{m-1}$ by the control circuit, the analog signal AIN or the inverted signal XAIN thereof and further either of the reference voltage VRT or VRB are supplied to each capacitor constituting the sampling use capacitor element, and the sampling operation and the comparison operation are carried out.

Each bit of the digital code $D_{out}$ is decided by one sampling operation and one comparison operation.

When deciding the most significant bit (MSB), at the time of the sampling operation, the switches $SW0_0$ to $SW0_{m-1}$ are connected to the input terminal of the analog signal AIN and the switches $SW1_0$ to $SW1_{m-1}$ are connected to the input terminal of the inverted signal XAIN of the analog signal AIN by the control signal $SW_S$ from the control circuit. Further, the switches 5, 6, 11, and 12 are set to a conductive state, and the switches 7 and 8 are set to a non-conductive state. By this, the switches $SW0_0$ to $SW0_{m-1}$ are charged to (AIN−$V_C$), the switches $SW1_0$ to $SW1_{m-1}$ are charged to (XAIN−$V_C$), and charges in accordance with the supplied voltages are stored in the capacitors.

Further, the DC component $V_C$ of the analog signal AIN is supplied to the capacitor elements $C_1$ and $C_2$, and the reference voltage $V_{ref}$ is supplied to the capacitor elements $C_3$ and $C_4$. Charges in accordance with the supplied voltages are stored in these capacitor elements.

At the time of the comparison operation, by the control signal $SW_S$ from the control circuit, the switches $SW0_0$ to $SW0_{m-2}$ among the switches $SW0_0$ to $SW0_{m-1}$ are connected to the input terminal of the reference voltage VRB, and only the switch $SW0_{m-1}$ is connected to the input terminal of the reference voltage VRT. By this, a half of the total capacitance of the capacitors $C0_0$, $C0_1$, $C0_2$, ..., and $C0_{m-1}$ is connected to the reference voltage VRT. The remaining half is connected to the reference voltage VRB. As a result, charges in accordance with {AIN−(VRT−VRB)/2} are stored in the capacitors $C0_0$, $C0_1$, $C0_2$, ..., and $C0_{m-1}$.

Similarly, among the switches $SW1_0$ to $SW1_{m-1}$, the switches $SW1_0$ to $SW1_{m-2}$ are connected to the input terminal of the reference voltage VRB, and only the switch $SW1_{m-1}$ is connected to the input terminal of the reference voltage VRT. By this, a half of the total capacitance of the capacitors $C1_0$, $C1_1$, $C1_2$, ..., and $C1_{m-1}$ is connected to the reference voltage VRT. The remaining half is connected to the reference voltage VRB. As a result, charges in accordance with {XAIN−(VRT−VRB)/2} are stored in the capacitors $C1_0$, $C1_1$, $C1_2$, ..., and $C1_{m-1}$.

The voltages V+ and V− of the nodes $ND_5$ and $ND_6$ at this time are input to the operational amplifier 10, and the signal $D_{m-1}$ shown in the following equation is output by the operational amplifier 10:

$$D_{m-1} = (V+) - (V-) = (AIN - XAIN) \qquad (10)$$

Note that the comparison operation of the voltage comparator COMP1a is almost the same as that of the voltage comparator COMP1 of the first embodiment. Therefore, here, a detailed explanation of the operation of the voltage comparator COMP1a will be omitted. Here, by constituting the successive approximation type ADC by using the voltage comparator COMP1a, the operation point of the operational amplifier 10 is held at almost a constant level without being influenced by the DC components $V_C$ of the analog signal AIN and the inverted signal XAIN thereof. Therefore in comparison with the voltage comparator COMP of the related art shown in FIG. 3, the operation stability and conversion precision of the voltage comparator COMP1a of the present embodiment are better.

The most significant bit of the digital code $D_{out}$ is determined by the control circuit 30 in accordance with the output signal $D_{m-1}$ of the operational amplifier 10. Then, by the value of the most significant bit MSB, the connection state of the switches $SW0_{m-1}$ and $SW1_{m-1}$ is set. For example, when the most significant bit is "1", the switch $SW1_{m-1}$ is switched to the reference voltage VRB side while the switch $SW0_{m-1}$ is connected to the reference voltage VRT. When the most significant bit is "0", the switch $SW0_{m-1}$ is switched to the reference voltage VRB side, while the switch $SW1_{m-1}$ is connected to the reference voltage VRT side as it is. Namely, the supplied voltages of the switches $SW0_{m-1}$ and $SW1_{m-1}$ become symmetrical regarding the reference voltages VRT and VRB.

By the above decision operation, the most significant bit of the digital code $D_{out}$ is determined and the connection states of the switches $SW0_{m-1}$ and $SW1_{m-1}$ are set.

Subsequently, the decision of the lower significant bit from the most significant bit of the digital code $D_{out}$, that is, MSB-1 bit, is carried out. At the time of the sampling operation, the switches $SW0_0$ to $SW0_{m-2}$ are connected to the input terminal of the analog signal AIN, and the switches $SW1_0$ to $SW1_{m-2}$ are connected to the input terminal of the inverted signal XAIN of the analog signal AIN. Note that the operation of the switches 5 to 12 is similar to that at the time of decision of the most significant bit.

At the time of the comparison operation, among the switches $SW0_0$ to $SW0_{m-2}$, the switches $SW0_0$ to $SW0_{m-3}$ are connected to the input terminal of the reference voltage VRB, and only the switch $SW0_{m-2}$ is connected to the input terminal of the reference voltage VRT. By this, half of the total capacitance of the capacitors $C0_0$, $C0_1$, $C0_2$, ..., and $C0_{m-2}$ is connected to the reference voltage VRT, and the remaining half is connected to the reference voltage VRB. At this time, the stored charges of these capacitors differ according to the most significant bit. For example, when the most significant bit is "0", the switch $SW0_{m-1}$ is connected to the VRB side and charges in accordance with {AIN−(VRT−VRB)/4} are stored in the capacitors $C0_0$, $C0_1$, ..., and $C0_{m-1}$, while when the most significant bit is "1", the switch $SW0_{m-1}$ is connected to the VRT side and charges in accordance with {AIN−3(VRT−VRB)/4} are stored in the capacitors $C0_0$, $C0_1$, and $C0_{m-1}$, On the other hand, In the switches $SW1_0$ to $SW_{m-2}$, the switches $SW1_0$ to $SW_{m-3}$ are connected to the input terminal of the reference voltage VRB, and only the switch $SW1_{m-2}$ is connected to the input terminal of the reference voltage VRT. By this, half of the total capacitance of the capacitors $C1_0, C1_1, C1_2, \ldots,$ and $C1_{m-2}$ is connected to the reference voltage VRT, and the remaining half is connected to the reference voltage VRB. At this time, the stored charges of these capacitors differ according to the most significant bit. For example, when the most significant bit is "0", the switch $SW1_{m-1}$ is connected to the VRT side and charges In accordance with $\{XAIN-3(VRT-VRB)/4\}$ are stored In the capacitors $C1_0, C1_1, \ldots,$ and $C1_{m-1}$, while when the most significant bit is "1", the switch $SW0_{m-1}$ is connected to the VRB side and charges in accordance with $\{XAIN-(VRT-VRB)/4\}$ are stored in the capacitors $C1_0, C1_1,$ and $C1_{m-1}$.

The voltages V+ and V− of the nodes $ND_5$ and $ND_6$ at this time are input to the operational amplifier 10, and the signal $D_{m-2}$ shown in the following equation is output by the operational amplifier 10:

$$D_{m-2}=(AIN-XAIN)+(VRT-VRB)/2 \qquad (11)$$

(most significant bit MSB=0)

$$D_{m-2}=(AIN-XAIN)-(VRT-VRB)/2 \qquad (12)$$

(most significant bit MSB=1)

The (MSB−1) bit of the digital code $D_{out}$ is determined by the control circuit 30 in accordance with the output signal $D_{m-2}$ of the operational amplifier 10. Then, the connection states of the switches $SW0_{m-2}$ and $SW1_{m-2}$ are set by the value of the (MSB−1) bit. For example, when the (MSB−1) bit is "1", the switch $SW1_{m-2}$ is switched to the reference voltage VRB side, while the switch $SW0_{m-2}$ is left connected to the reference voltage VRT side as it is. When the (MSB−1) bit is "0", the switch $SW0_{m-2}$ is switched to the reference voltage VRB side, while the switch $SW1_{m-2}$ is left connected to the reference voltage VRT side as it is.

After this, a similar decision operation is repeatedly carried out until all of the m number of bits up to the least significant bit (LSB) are decided. The combination of switches $SW0_0$ to $SW0_{m-1}$ and the switches $SW1_0$ to $SW1_{m-1}$ giving the smallest difference between (AIN−XAIN) and (VRV−TRB) is set by the control circuit 30, and the digital code $D_{out}$ in accordance with this is obtained.

As explained above, according to the present embodiment, a charge redistribution type successive approximation ADC is constituted by using the voltage comparator COMP1a, the sampling operation and the comparison operation are repeatedly carried out based on the control of the control circuit 30, the combination of switches $SW0_0$ to $SW0_{m-1}$ and $SW1_0$ to $SW1_{m-1}$ connected to the sampling use capacitor elements is set so that the difference between (AIN−XAIN) and (VRV−TRB) becomes the minimum, and the digital code $D_{out}$ is sequentially decided from the most significant bit MSB to the least significant bit LSB, therefore a stable decision operation or high precision conversion result is obtained without any influence of the DC component $V_C$ of the analog signal AIN.

Next, an explanation will be made of a third embodiment of the present invention.

Figure 11:
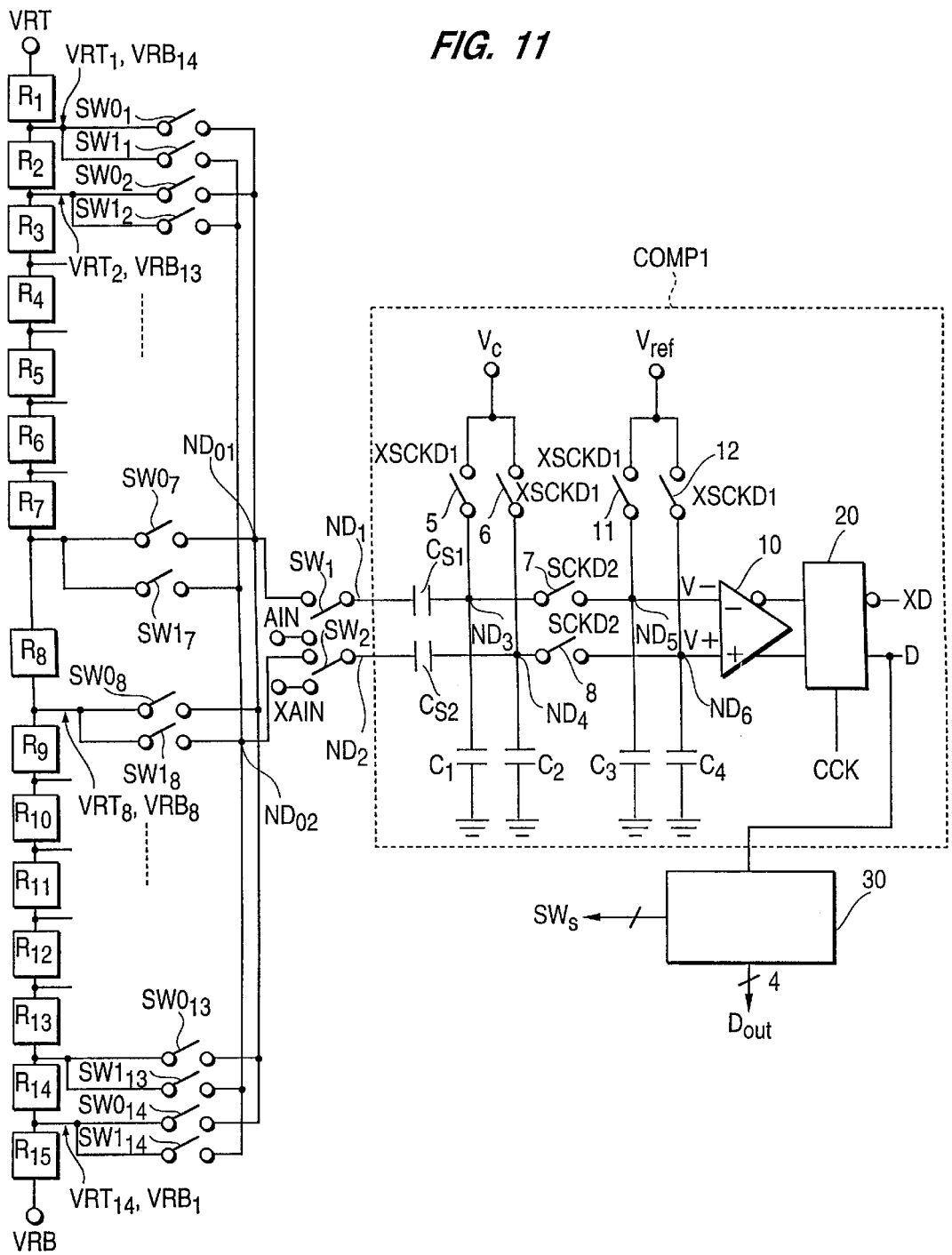
FIG. 11 is a circuit diagram of a resistor voltage division type successive approximation type ADC using the voltage comparator according to a third embodiment of the present invention.

FIG. 11 is a circuit diagram of an example of a successive approximation type ADC using the voltage comparator of the present embodiment.

The illustrated successive approximation type ADC is a resistor voltage division type successive approximation type ADC, for example, a successive approximation type ADC for converting an analog signal AIN to a four-bit digital code $D_{out}$. Fifteen voltage division use resistors $R_1, R_2, \ldots,$ and $R_{15}$ are provided between the reference voltages VRT and VRB. The reference voltages $VRT_n$ and $VRB_n$ (n=1, 2, ..., 14) are obtained from these resistors.

The voltage comparator COMP1 is similar to the voltage comparator shown in FIG. 7. Here, constituent parts of the voltage comparator COMP1 are represented by using the same references as those of FIG. 7 and a detailed explanation of the operation of the voltage comparator COMP1 will be omitted.

In the successive approximation type ADC shown in FIG. 11, the differential voltage between the analog signal AIN and the inverted signal XAIN thereof and the differential voltage between the reference voltages $VRT_n$ and $VRB_n$ generated by the voltage division use resistors $R_1$ to $R_{15}$ are compared by the voltage comparator COMP1, and the bits of the digital code $D_{out}$ are sequentially determined from the most significant bit to the least significant bit in accordance with the result of the comparison.

As illustrated, the input node $ND_1$ of the voltage comparator COMP1 is connected to either of the input terminal of the analog signal AIN or the node $ND_{01}$ by the switch $SW_1$, and the input node $ND_2$ is connected to either of the input terminal of the inverted signal XAIN of the analog signal AIN or the node $ND_{02}$ by the switch $SW_2$.

The node $ND_{01}$ is connected to connection points of the voltage division use resistors $R_1$ to $R_{15}$ via the switches $SW0_1, SW0_2, \ldots,$ and $SW0_{14}$, respectively. One of the reference voltages $VRB_1$ to $VRB_{14}$ is selected by these switches and input to the node $ND_{02}$.

The switches $SW0_1, SW0_2, \ldots, SW0_{14}, SW1_1, SW1_2, \ldots,$ and $SW1_{14}$, and switches $SW_1$ and $SW_4$ are controlled in their connection states by the control circuit 30. At the time of the sampling operation, the analog signal AIN and the inverted signal XAIN thereof are input to the node $ND_1$ of the voltage comparator COMP1, while at the time of the comparison operation, the reference voltages $VRT_n$ and $VRB_n$ are input to the node $ND_2$ of the voltage comparator COMP1. The bits of the digital code $D_{out}$ are sequentially determined in accordance with the output signal D of the voltage comparator COMP1 at the time of the comparison operation.

For example, when deciding the most significant bit MSB, at the time of the sampling operation, the switches $SW_1$ and $SW_2$ are respectively connected to the analog signal AIN and the inverted signal XAIN side thereof, while at the time of the comparison operation, the switches $SW_1$ and $SW_2$ are respectively connected to the nodes $ND_{01}$ and $ND_{02}$. At this time, the switches $SW0_8$ and $SW1_8$ are set to a conductive state, and the divided voltages near the intermediate voltage of the reference voltages VRT and VRB, that is, the reference voltages $VRT_8$ and $VRB_8$ are respectively input to the nodes $ND_{01}$ and $ND_{02}$. At the time of the comparison operation, the most significant bit of the digital code $D_{out}$ is decided in accordance with the output signal D of the voltage comparator COMP1.

Next, the switching state at the time of determination of the (MSB−1) bit is controlled based on the most significant bit, and the (MSB−1) bit is decided. In this case, at the time of the sampling operation, the switches $SW_1$ and $SW_2$ are respectively connected to the analog signal AIN and the inverted signal XAIN side thereof similar to the time of decision of the most significant bit MSB. At the time of the comparison operation, the switches $SW_1$ and $SW_2$ are respectively connected to the nodes $ND_{02}$ and $ND_{02}$. Note, in this case, the ON/OFF state of the switches $SW0_1, SW0_2, \ldots,$ and $SW0_{14}$ and the switches $SW1_1, SW1_2, \ldots,$ and $SW1_{14}$ are controlled in accordance with the most significant bit MSB, and the reference voltage to be input to the nodes $ND_1$ and $ND_1$ is selected.

For example, when the most significant bit is "0", at the time of the comparison operation, the switches $SW0_{12}$ and $SW1_4$ are set to a conductive state, and the reference voltages $VRT_{12}$ and $VRB_{12}$ are selected and respectively input to the nodes $ND_1$ and $ND_2$. On the other hand, when the most significant bit is "1", the switches $SW0_4$ and $SW1_{12}$ are set to a conductive state, and the reference voltages $VRT_4$ and $VRB_4$ are selected and respectively input to the nodes $ND_1$ and $ND_2$. Based on such a setup of switches, one sampling operation and one comparison operation are carried out, and the (MSB-1) bit is decided in accordance with the output signal D of the voltage comparator COMP1.

By repeatedly performing a similar decision operation, the bits from the most significant bit to the least significant bit are sequentially determined, and the digital code $D_{out}$ in accordance with the input analog signal AIN is obtained.

As explained above, according to the present embodiment, the resistor voltage division type successive approximation type ADC is constituted by using the voltage comparator COMP1, the sampling operation and the comparison operation are repeatedly carried out under the control of the control circuit 30, at the time of the sampling operation, the analog signal AIN and the inverted signal XAIN thereof are selected by the switches $SW_1$ and $SW_2$ and respectively input to the nodes $ND_1$ and $ND_2$, and at the time of the comparison operation, one set of switches $SW0_m$ and $SW1_n$ are selected from among the switches $SW0_1$ to $SW0_{14}$ and $SW1_1$ to $SW1_{14}$ in accordance with the decided bit and made conductive, the reference voltages $VRT_n$ and $VRB_n$ are respectively input to the nodes $ND_1$ and $ND_2$, and the bits of the digital code $D_{out}$ are sequentially decided in accordance with the output signal D of the voltage comparator COMP1, therefore a stable conversion operation and high precision conversion code $D_{out}$ are obtained by the voltage comparator COMP1 without being influenced by the fluctuation of the DC component $V_C$ of the input analog signal AIN.

Next, an explanation will be made of a fourth embodiment.

In the third embodiment, the explanation was made of a successive approximation type ADC to which the voltage comparator of the present invention was applied, but needless to say the voltage comparator of the present embodiment can be applied to not only a successive approximation type ADC, but also a parallel type ADC. For example, in the parallel type ADC shown in FIG. 1, the voltage comparators $COMP_1$ to $COMP_{14}$ can be replaced by the voltage comparator COMP1 of the present embodiment shown in FIG. 7.

In this case, the structure of the circuit is similar to that of FIG. 1. Here, an explanation will be made by using FIG. 1. Note, other than the analog signal AIN, the inverted signal XAIN thereof, and reference voltage $V_{ref}$, the DC component $V_C$ of the analog signal AIN is input to the voltage comparators $COMP_1$ to $COMP_{14}$ as indicated by the dotted line.

The parallel type ADC shown in FIG. 1 outputs a four-bit digital code $D_{out}$ in accordance with the input analog signal AIN. Divided reference voltages $VRT_n$ and $VRB_n$ are obtained by 15 voltage division use resistors $R_1$ to $R_{15}$ connected in series between the reference voltages VRT and VRB. These reference voltages $VRT_n$ and $VRB_n$ are input in pairs to the voltage comparators $COMP_1$ to $COMP_{14}$. The voltage comparators $COMP_1$ to $COMP_{14}$ compare the differential voltage between the input analog signal AIN and the inverted signal XAIN thereof and the differential voltage between the reference voltages $VRT_n$ and $VRB_n$. In each voltage comparator $COMP_N$, levels of the output signal D and the inverted signal XD thereof are set based on (AIN-XAIN)-($VRT_n$-$VRB_n$). Then, the AND gates $AGT_1$ to $AGT_{15}$ convert the output signals of the voltage comparators $COMP_1$ to $COMP_{14}$ and output them to the encoder ECD. The encoder ECD outputs the four-bit digital code $D_{out}$.

By using a plurality of voltage comparators $COMP_n$ in accordance with the number of bits of the digital code $D_{out}$ in this way, all bits of the digital code $D_{out}$ can be determined by one sampling operation and one comparison operation, so the conversion can be carried out at a higher speed than the successive approximation type ADC.

According to the present embodiment, the reference voltages $VRT_n$ and $VRB_n$ obtained by the voltage division use resistors $R_1$ to $R_{15}$ connected in series are input to the voltage comparator $COMP_n$, the analog signal AIN, the inverted signal XAIN thereof, the DC component $V_C$ of the analog signal AIN, and the reference voltage $V_{ref}$ are input to the voltage comparator $COMP_n$, and, by the sampling operation and the comparison operation, each voltage comparator compares the differential voltage between the analog signal AIN and the inverted signal XAIN thereof and the differential voltage between the reference voltages $VRT_n$ and $VRB_n$ and sets the level of the output signal in accordance with the result of comparison, and the AND gates $AGT_1$ to $AGT_{15}$ and the encoder ECD convert the output signal of the voltage comparators to the digital code $D_{out}$, therefore all bits of the digital code $D_{out}$ can be determined by one sampling and comparison operation, the fluctuation of the operation points at the time of the sampling operation and at the time of the comparison operation can be kept small, and an improvement of the conversion precision and the operation stability can be achieved without being influenced by the fluctuation of the DC component of the analog signal.

As explained above, according to the voltage comparator of the present invention, there is an advantage that the conversion precision and the operation stability can be held without an increase of the size of the circuit and without influence by the fluctuation of the DC component of the analog signal to be converted.

Further, in the analog-to-digital converter constituted by the voltage comparator of the present invention, an improvement of the conversion precision can be realized, an increase of the costs of the converter can be suppressed, and low power consumption can be achieved.

What is claimed is:

1. A voltage comparator performing a sampling operation and a comparison operation and comparing a differential voltage between an input signal and an inverted signal thereof with a differential voltage of first and second reference signals, comprising a first sampling use capacitor element for storing a charge in accordance with the input signal at the time of the sampling operation and for storing a charge in accordance with the first reference signal and the input signal at the time of th e comparison operation;

a second sampling use capacitor element for storing a charge in accordance with the inverted signal of the input signal at the time of the sampling operation and for storing a charge in accordance with the second reference signal and the inverted signal of the input signal at the time of the comparison operation;

a first capacitor element, with one electrode which is connected to a first node common with the first sampling use capacitor element and with an other electrode which is connected to a common potential, which stores a charge in accordance with the DC component of the input signal at the time of the sampling operation;

a second capacitor element, with one electrode which is connected to a second node common with the second sampling use capacitor element and with another electrode which is connected to a common potential, which stores a charge in accordance with the DC component of the input signal at the time of the sampling operation;

a third capacitor element, with one electrode which is connected to a third node and with another electrode which is connected to a common potential, which stores a charge in accordance with the first and second reference signals at the time of the sampling operation;

a fourth capacitor element, with one electrode which is connected to a fourth node and with another electrode which is connected to a common potential, which stores a charge in accordance with the first and second reference signals at the time of the sampling operation;

a first switching means for connecting the first node and the third node so as to generate at the connection point a first voltage in accordance with the stored charge of each capacitor element connected to the connection point at the time of the comparison operation and separating the first node and the third node at the time of the sampling operation;

a second switching means for connecting the second node and the fourth node to generate at the connection point a second voltage in accordance with the stored charge of each capacitor element connected to the connecting point at the time of the comparison operation and separating the second node and the fourth node at the time of the sampling operation; and a voltage comparing means for comparing the first voltage and second voltage.

2. A voltage comparator as set forth in claim 1, further having:

a first switch set to a conductive state at the time of the sampling operation and set to a non-conductive state at the time of the comparison operation between the first node to which the first capacitor element is connected and the input terminal of the DC component and a second switch set to a conductive state at the time of the sampling operation and set to a non-conductive state at the time of the comparison operation between the second node to which the second capacitor element is connected and the input terminal of the DC component.

3. A voltage comparator as set forth in claim 1, further having:

a third switch set to a conductive state at the time of the sampling operation and set to a non-conductive state at the time of the comparison operation between said third node to which said third capacitor element is connected and the input terminal of the intermediate level voltage of said first and second reference signals and a fourth switch set to a conductive state at the time of the sampling operation and set to a non-conductive state at the time of the comparison operation between said fourth node to which said fourth capacitor element is connected and the input terminal of the intermediate level voltage of said first and second reference signals.

4. A voltage comparator as set forth in claim 1, wherein: said first switching means comprises a fifth switch connected between said first and third nodes, set to a non-conductive state at the time of the sampling operation, and set to a conductive state at the time of the comparison operation; and said second switching means comprises a sixth switch connected between said second and fourth nodes, set to a non-conductive state at the time of the sampling operation, and set to a conductive state at the time of the comparison operation.

5. A voltage comparator as set forth in claim 1, wherein said voltage comparing means is constituted by a differential type amplifier with an input terminal which is connected to said fourth node and with an inverted input terminal which is connected to said third node.

6. A voltage comparator as set forth in claim 1, further having:

a first input switching means for supplying said input signal to said first sampling use capacitor element at the time of the sampling operation and supplying said first reference signal at the time of the comparison operation and a second input switching means for supplying the inverted signal of said input signal to said second sampling use capacitor element at the time of the sampling operation and supplying said second reference signal at the time of the comparison operation.

7. A voltage comparator as set forth in claim 6, wherein said first input switching means has:

a first input switching use switch connected between said first sampling use capacitor element and the input terminal of said input signal and set to a conductive state only at the time of the sampling operation and a second input switching use switch connected between the input terminal of said first reference signal and said first sampling use capacitor element and set to a conductive state only at the time of the comparison operation.

8. A voltage comparator as set forth in claim 6, wherein said second input switching means has:

a third input switching use switch connected between said second sampling use capacitor element and the inverted signal of said input signal and set to a conductive state only at the time of the sampling operation and a fourth input switching use switch connected between the input terminal of said second reference signal and said second sampling use capacitor element and set to a conductive state only at the time of the comparison operation.

9. An analog-to-digital converter for generating a digital code in accordance with the level of an input signal, which is of the successive approximation type for sequentially deciding bits from the most significant bit to the least significant bit of the digital code by repeatedly performing a sampling operation and comparison operation, comprising a first sampling use capacitor element for storing a charge in accordance with the input signal at the time of the sampling operation and for storing a charge in accordance with a first decision use reference signal generated from first and second reference signals and the input signal in accordance with the decided bit at the time of the comparison operation;

a second sampling use capacitor element for storing a charge in accordance with an inverted signal of the input signal at the time of the sampling operation and for storing a charge in accordance with a second decision use reference signal generated from the first and second reference signals and the inverted signal of the input signal in accordance with the decided bit at the time of the comparison operation;

a first capacitor element, with one electrode which is connected to a first node common with the first sampling use capacitor element and with another electrode which is connected to a common potential, which stores a charge in accordance with the DC component of the input signal at the time of the sampling operation;

a second capacitor element, with one electrode which is connected to a second node common with the second sampling use capacitor element and with another electrode which is connected to a common potential, which stores a charge in accordance with the DC component of the input signal at the time of the sampling operation;

a third capacitor element, with one electrode which is connected to a third node and with another electrode which is connected to a common potential, which stores a charge in accordance with the first and second reference signals at the time of the sampling operation;

a fourth capacitor element, with one electrode which is connected to a fourth node and with another electrode which is connected to a common potential, which stores a charge in accordance with the first and second reference signals at the time of the sampling operation;

a first switching means for connecting the first node and the third node so as to generate at a connection point a first voltage in accordance with the stored charge of each capacitor element connected to the connection point at the time of the comparison operation and separating the first node and the third node at the time of the sampling operation;

a second switching means for connecting the second node and the fourth node so as to generate at the connection point a second voltage in accordance with the stored charge of each capacitor element connected to the connection point at the time of the comparison and separating the second node and the fourth node at the time of the sampling operation;

a voltage comparing means for comparing the first voltage and second voltage; and a control circuit for controlling the sampling and the comparison operation and determining each bit of the digital code in accordance with the result of comparison of the voltage comparing means.

10. An analog-to-digital converter as set forth in claim 9, wherein the first sampling use capacitor element comprises a plurality of capacitors provided in accordance with the number of bits of the digital code, each of which has one electrode which is commonly connected, has another electrode to which the input signal is supplied at the time of the sampling operation, and receives either of the first or second reference signal in accordance with the decided bit at the time of the comparison operation; and the second sampling use capacitor element comprises a plurality of capacitors provided in accordance with the number of bits of the digital code, each of which has one electrode which is commonly connected, has another electrode to which an inverted signal of the input signal is supplied at the time of the sampling operation, and receives either of the first or second reference signal in accordance with the decided bit at the time of the comparison operation.

11. An analog-to-digital converter as set forth in claim 9, wherein:

it has a plurality of voltage division use resistors provided in accordance with the number of bits of the digital code which are connected in series between the first and second reference signals to generate a plurality of pairs of first and second reference signals, and the control circuit selects a pair from among the plurality of pairs of reference signals in accordance with the decided bit at the time of the comparison operation and supplies the same to the first and second sampling use capacitor elements.

12. An analog-to-digital converter for generating a digital code in accordance with the level of an input signal, which is of a parallel type having a plurality of voltage division use resistors provided in accordance with the number of bits of the digital code which are connected in series between first and second reference signals, a comparator for performing a comparison operation based on a plurality of pairs of reference signals comprised by first and second reference signals generated by these resistors and forming pairs and the input signal, and an encoder for generating the digital code in accordance with the result of comparison of the comparator, wherein the comparator comprises a plurality of voltage comparators for performing a sampling operation and a comparison operation, each voltage comparator comparing a differential voltage of the input signal and an inverted signal thereof and a differential voltage of a pair of reference signals selected from among the plurality of pairs of reference signals, the voltage comparator comprising:

a first sampling use capacitor element for storing a charge in accordance with the input signal at the time of the sampling operation and for storing a charge in accordance with the first reference signal and the input signal at the time of the comparison operation;

a second sampling use capacitor element for storing a charge in accordance with the inverted signal of the input signal at the time of the sampling operation and for storing a charge in accordance with the second reference signal and the inverted signal of the input signal at the time of the comparison operation;

a first capacitor element, with one electrode which is connected to a first node common with the first sampling use capacitor element and with another electrode which is connected to a common potential, which stores a charge in accordance with the DC component of the input signal at the time of the sampling operation;

a second capacitor element, with one electrode which is connected to a second node common with the second sampling use capacitor element and with another electrode which is connected to a common potential, which stores a charge in accordance with the DC component of the input signal at the time of the sampling operation;

a third capacitor element, with one electrode which is connected to a third node and with another electrode which is connected to a common potential, which stores a charge in accordance with the intermediate level of the first and second reference signals at the time of the sampling operation;

a fourth capacitor element, with one electrode which is connected to a fourth node and with another electrode which is connected to a common potential, which stores a charge in accordance with the intermediate level of the first and second reference signals at the time of the sampling operation;

a first switching means for connecting a first node and a third node so as to generate at the connection point a first voltage in accordance with the stored charge of each capacitor element connected to the connection point at the time of the comparison operation and separating the first node and the third node at the time of the sampling operation;

a second switching means for connecting a second node and a fourth node so as to generate at the connection point a second voltage in accordance with the stored charge of each capacitor element connected to the connection point at the time of the comparison operation and separating the second node and the fourth node at the time of the sampling operation; and a voltage comparing means for comparing the first voltage and second voltage.

* * * * *